(12) United States Patent
Mao et al.

(10) Patent No.: US 8,890,484 B2
(45) Date of Patent: Nov. 18, 2014

(54) BATTERY STATE-OF-CHARGE ESTIMATOR USING ROBUST $H_\infty$ OBSERVER

(75) Inventors: Xiaofeng Mao, Warren, MI (US);
Xidong Tang, Royal Oak, MI (US);
Yiran Hu, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 372 days.

(21) Appl. No.: 13/466,374

(22) Filed: May 8, 2012

(65) Prior Publication Data
US 2013/0300377 A1 Nov. 14, 2013

(51) Int. Cl.
*H02J 7/04* (2006.01)

(52) U.S. Cl.
USPC ............... 320/152; 320/23; 320/40; 320/59; 320/60

(58) Field of Classification Search
CPC .......... B60L 11/1861; B60L 2240/545; B60L 2240/547; B60L 2240/662; G01R 31/3606; G01R 31/3679; H02J 7/00; H02J 7/007; Y02E 60/12; H01M 10/44; Y02T 10/7044; Y10S 320/21
USPC .................................. 320/23, 40, 59, 64, 152
See application file for complete search history.

(56) References Cited

U.S. PATENT DOCUMENTS

| | | | | |
|---|---|---|---|---|
| 3,781,658 A | * | 12/1973 | Godshalk | 324/431 |
| 4,310,793 A | * | 1/1982 | Sheldrake et al. | 322/28 |
| 5,381,096 A | * | 1/1995 | Hirzel | 324/427 |
| 5,710,699 A | * | 1/1998 | King et al. | 363/132 |
| 6,157,165 A | * | 12/2000 | Kinoshita et al. | 320/116 |
| 7,358,704 B2 | * | 4/2008 | Yumoto et al. | 320/132 |
| 7,561,978 B2 | * | 7/2009 | Koch et al. | 702/63 |
| 8,008,891 B2 | * | 8/2011 | Yun et al. | 320/132 |
| 8,207,706 B2 | * | 6/2012 | Ishikawa | 320/132 |
| 8,321,164 B2 | * | 11/2012 | Liu et al. | 702/63 |
| 8,548,761 B2 | * | 10/2013 | Lim et al. | 702/63 |
| 8,706,333 B2 | * | 4/2014 | Li | 701/22 |

OTHER PUBLICATIONS

Carlos E. de Souza et al., Robust H(Infinity) Filtering for Discrete-Time Linear Systems With Uncertain Time-Varying Parameters, IEEE Transactions on Signal Processing, vol. 54, No. 6, Jun. 2006, pp. 2110-2118.

* cited by examiner

*Primary Examiner* — Sun Lin

(57) ABSTRACT

A battery state-of-charge (SOC) estimator uses a robust $H_\infty$ filter design by taking into account the battery parameter uncertainties, which is due to battery age, variation, and operating conditions such as temperature and SOC level. Each of the time-varying battery parameter values and their variation rates are bounded. By utilizing the parameter variation bounds and parameter variation rate bounds into the design process and minimizing the $H_\infty$ gain from the measured current signal to the estimation error of $V_{oc}$, the battery SOC estimator can achieve enhanced robustness to the variations of battery age, variation, and operating conditions that include temperature and SOC level.

19 Claims, 3 Drawing Sheets

BATTERY STATE-OF-CHARGE ESTIMATOR USING ROBUST $H_\infty$ OBSERVER

BACKGROUND OF INVENTION

An embodiment relates generally to determining a state-of-charge of a battery within a transportation vehicle.

A state-of-charge (SOC) refers to a stored charge available to perform work relative to that which is available after the battery has been fully charged. The state-of-charge can be viewed as a thermodynamic quantity, enabling one to assess the potential energy of the system.

Open circuit voltage is used to determine the SOC; however, the accuracy of the open circuit voltage is critical to determining a state of charge and is difficult to estimate during the battery use. If there is measurement error, then the state-of-charge estimation will be in error according to the factor of the measurement error. Moreover, for conventional vehicles and battery systems, the battery must be at rest (i.e., no load or recharging) for a respective duration of time before the open circuit voltage can be obtained. Prior art systems that attempt to estimate the open circuit voltage while the battery is in use are deficient for failing to consider parameter uncertainties such internal resistances, capacitances, and other battery parameters which will vary based on age and temperature of the battery.

SUMMARY OF INVENTION

An embodiment contemplates a method of determining a state-of-charge for a battery while connected to a plurality of loads. A terminal voltage of the battery is measured. A temperature of the battery is measured coinciding with the measured terminal voltage. The terminal voltage measurement is input to the first linear time invariant infinity observer filter. The first linear time invariant infinity observer filter is developed in an off-vehicle design process. The first linear time invariant infinity observer filter minimizes a gain of an output energy signal to an input energy signal of the battery. An open circuit voltage is estimated in response to the measured terminal voltage input to the first linear time invariant infinity observer filter. The state of charge of the battery is determined as a function of the open circuit voltage. The battery is regulated in response to the state of charge.

DETAILED DESCRIPTION

Figure 1:
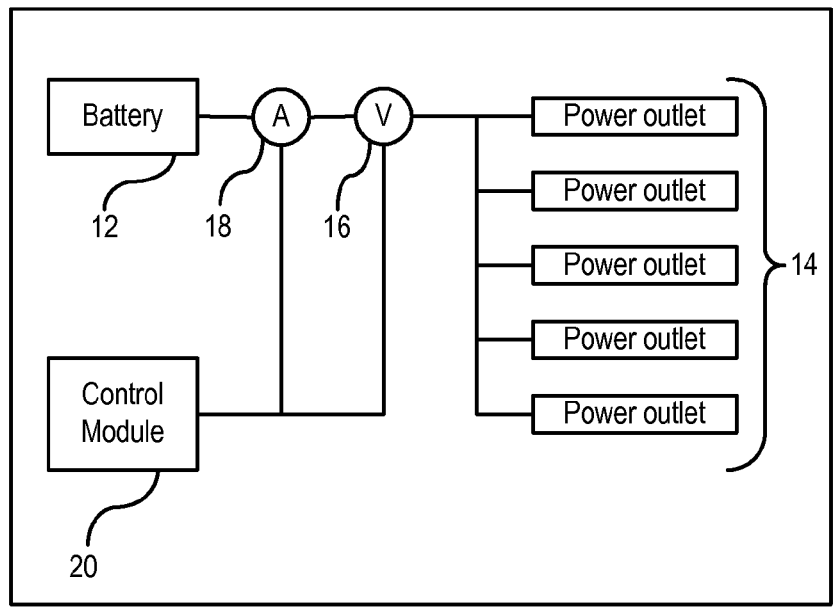
FIG. 1 is a block diagram of an embodiment of a vehicle incorporating a state-of-charge (SOC) estimation system.

FIG. 1 illustrates a block diagram of an embodiment of a vehicle 10 incorporating a state-of-charge (SOC) estimation system. The vehicle 10 includes a battery 12. The battery 12 is preferably a lithium-ion battery; however, it should be understood that other types of batteries may be used herein by modifying a battery system model, the battery system model which will be discussed in detail later. The methodology described herein can determine the SOC of the battery when the battery is in use, as opposed to the battery having to be at rest for a predetermined period of time. The advantages of the proposed methodology over existing techniques are enhanced robustness relative to battery age, battery variations, operating conditions, current sensor noise, and reduced calibration time.

To enhance control of the battery systems in hybrid vehicles for long battery life and good fuel economy, onboard systems determine and process battery parameters such as the open-circuit voltage ($V_{oc}$), the ohmic resistance, the battery capacitance, etc. For example, the $V_{oc}$ is used to estimate the battery SOC, which is an index associated with battery condition. However, the $V_{oc}$ and other battery internal parameters are not directly measurable during vehicle operation. Therefore, an efficient and effective technique used to determine the $V_{oc}$ extracts the battery parameters from measured signals such as battery terminal voltage and current.

The (lithium-ion battery is a rechargeable type of battery in which ions move from the negative electrode to the positive electrode during discharge, and back when charging.

There are three primary components of a lithium-ion battery. The primary components are the negative electrode, positive electrode, and the electrolyte. The negative electrode of a conventional lithium-ion cell is made from carbon (e.g., graphite). The positive electrode is a metal oxide and is generally one of three materials: a layered oxide (e.g., lithium cobalt oxide), a polyanion or a spinel (e.g., such as lithium manganese oxide), and the electrolyte is a lithium salt in an organic solvent. The electrolyte is typically a mixture of organic carbonates such as ethylene carbonate or diethyl carbonate containing complexes of lithium ions. The electrochemical roles of the electrodes change between anode and cathode, depending on the direction of current flow through the cell.

During discharge, lithium ions carry current from the negative electrode to the positive electrode. During charging, an external electrical power source applies an over-voltage forcing the current to pass in a reverse direction. The lithium ions then migrate from the positive electrode to the negative electrode. The lithium-ions become embedded in the porous electrode material.

To better enhance a system that utilize lithium ion batteries, such as hybrid electric vehicles, on-board vehicle systems determine and process battery parameters including, but not limited to, open-circuit voltage ($V_{oc}$), the ohmic resistance, and battery capacitance.

The vehicle battery 12 is electrically coupled to a plurality of devices 14 which utilize the battery as a power source. The vehicle 10 may further include a current sensor 16, a voltage meter 18, and a control module 20.

The plurality of devices 14 include, but are not limited to, power outlets adapted to an external device, accessories, components, subsystems, and systems of a vehicle. Moreover, one of the plurality of devices 14 may include a motor/generator used in hybrid and electric vehicles. The current sensor 16 is used to monitor the current leaving the vehicle battery 12. The voltmeter 18 measures a voltage so that the V may be determined. A control module 20, or similar module, obtains, derives, monitors, and/or processes a set of parameters associated with the vehicle battery 12. These parameters may include, without limitation, current, voltage, SOC, battery capacity, battery internal resistances, battery internal reactance, battery temperature, and power output of the vehicle battery. The control module 20 includes an algorithm, or like, for executing a vehicle SOC estimation technique.

The control module 20 utilizes the $V_{oc}$ of the battery for determining the SOC. It should be understood that the $V_{oc}$ is not directly measurable during vehicle operation. Typically, the $V_{oc}$ may be accurately measured only after the $V_{oc}$ equilibrium is obtained, which occurs a predetermined time after battery charging has been discontinued (i.e., either by an ignition off operation or other charging device). The predetermined time to reach $V_{oc}$ equilibrium is typically about 24 hours after charging the battery is discontinued. That is, an $V_{oc}$ measurement is accurate only when the battery voltage is under the equilibrium conditions. Electrical charges on the surface of the battery's plates cause false voltmeter readings. False voltmeter readings are due to surface charges on the battery plates. When a battery is charged, the surface of the plates may have a higher charge than the inner portions of the plates. After a period of time after charging has been discontinued, the surface charge on the surface of the plates will become slightly discharged as a result of the charged energy penetrating deeper into the plates. Therefore, the surface charge, if not dissipated to the inner portion of the plates, may make a weak battery appear good.

The embodiment described herein provides a technique for estimating an accurate $V_{oc}$ measurement while the battery is in use. The technique described herein extracts battery parameters from measured signals such as battery terminal voltage and current. Moreover, the system models other parameters within the battery circuit such as ohmic resistance parameters and capacitance parameters for determining the $V_{oc}$ while the battery is in use.

To estimate the $V_{oc}$ of the battery, an $V_{oc}$ estimation technique or model utilizes a robust Linear Time Invariant (LTI) $H_\infty$ observer filter that is designed offline. The robust LTI $H_\infty$ observer filter may be implemented in real time when both the battery voltage sensor and the battery current sensor are available or may be implemented when only the battery voltage sensor is available. The robust LTI $H_\infty$ observer filter estimates the battery states including the $V_{oc}$ by minimizing the $H_\infty$ gain with respect to current. The $H_\infty$ gain is the ratio of the gain from the energy of the input signal, which is the measured current, to the output signal, which is the estimation error of the $V_{oc}$. The goal is to generate a filter that minimizes the gain as much as possible while still producing a feasible solution. The filter is designed off-vehicle. Once a filter is designed that produces a feasible solution using the minimum gain, the filter, which is a LTI system, is implemented in the vehicle system for estimating the $V_{oc}$. The $V_{oc}$ is used to determine the SOC, which thereafter can be used to enhance factors including, but not limited to, improve fuel economy, prolonging battery life, enhancing battery charging control and vehicle power management, and reducing warranty cost.

Figure 2:
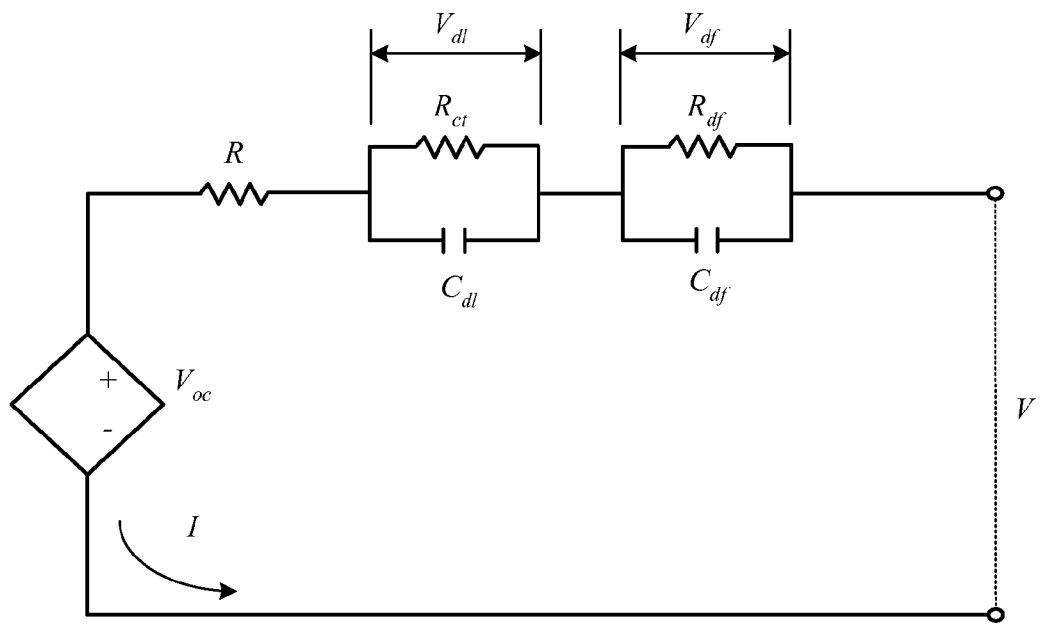
FIG. 2 is a schematic of a two-RC pair equivalent circuit.

FIG. 2 illustrates a two-RC pair equivalent circuit. The following is a model of the two-RC pair equivalent circuit illustrated in FIG. 2. The model is represented by the following matrices:

$$\begin{bmatrix} V_{dl}(k+1) \\ V_{df}(k+1) \\ V_{oc}(k+1) \end{bmatrix} = \begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} + \begin{bmatrix} R_{ct}(1 - e^{-T/R_{ct}C_{dl}}) \\ R_{df}(1 - e^{-T/R_{df}C_{df}}) \\ \mu \end{bmatrix} I(k) \quad (1)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k) \quad (2)$$

where $\mu$ describes the relationship between $V_{oc}$ and I, $C_{dl}$ is a double layer capacitance of the battery model, $V_{dl}$ is a double layer voltage of the battery model, $R_{ct}$ is a charge transfer resistance of the battery model, $V_{df}$ is a diffusion voltage of the battery model, $C_{df}$ is a capacitance diffusion of the battery model, $R_{df}$ is a diffusion resistance of the battery model, R is the ohmic resistance, T is the sample time, V is the battery terminal voltage, and I is the battery terminal current.

Each of the battery parameters (i.e. $R_{ct}$, $C_{dl}$, $R_{df}$, $C_{df}$, $\mu$, and R) in the FIG. 2 is time-varying, depending on battery age, variation, and operating conditions, (e.g. temperature and SOC level). In addition, $\mu$ is a function of battery temperature, battery capacity and SOC. It is also noted that each of these parameters is bounded in practice. As a result, the matrices illustrated above can be rewritten as follows:

$$\begin{bmatrix} V_{dl}(k+1) \\ V_{df}(k+1) \\ V_{oc}(k+1) \end{bmatrix} = \begin{bmatrix} \theta_1(k) & 0 & 0 \\ 0 & \theta_2(k) & 0 \\ 0 & 0 & 1 \end{bmatrix} \begin{bmatrix} V_{dl}(k) \\ V_{df}(k) \\ V_{oc}(k) \end{bmatrix} + \begin{bmatrix} \theta_3(k) \\ \theta_4(k) \\ \theta_5(k) \end{bmatrix} I(k) \quad (3)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + \theta_6(k) I(k) \quad (4)$$

where
$\theta_1(k) = e^{-T/R_{ct}C_{dl}}$,
$\theta_2(k) = e^{-T/R_{df}C_{df}}$,
$\theta_3(k) = R_{ct}(1 - e^{-T/R_{df}C_{df}})$,
$\theta_4(k) = R_{df}(1 - e^{-T/R_{dl}C_{dl}})$,
$\theta_5(k) = \mu$, and
$\theta_6(k) = R$.

Since all battery parameters and their variation speed are bounded in practice, $\theta_1(k)$, $\theta_2(k)$, $\theta_3(k)$, $\theta_4(k)$, $\theta_5(k)$, and $\theta_6(k)$ are all bounded. Moreover, the variation speeds with respect to $\theta_1(k)$, $\theta_2(k)$, $\theta_3(k)$, $\theta_4(k)$, $\theta_5(k)$, and $\theta_6(k)$ are also bounded.

To design a robust LTI $H_\infty$ observer filter offline, a state vector of the system model is generated that represents the battery circuit. The state vector is represented by the expression $x(k) = [V_{dl}(k) V_{df}(k) V_{oc}(k)]$ at time step k with measured battery voltage $V_k$ and measured battery current $I_k$.

Next, expressions for an estimated signal s(k) and a measured output y(k) of the battery circuit are defined. s(k) is a signal that is estimated online that is substantially equal to the $V_{oc}$, and y(k) is a vector comprising output signals that can be measured online.

An augmented system model for the state vector x(k), output signal y(k), and estimated signal s(k) may be represented by the following expressions:

$$x(k+1) = A(\theta(k))x(k) + B(\theta(k))w(k) \quad (5)$$

$$y(k) = C(\theta(k))x(k) + D(\theta(k))w(k) \quad (6)$$

$$s(k) = C_s(\theta(k))x(k) + D_s(\theta(k))w(k) \quad (7)$$

where $\theta(k)$ is a vector of unknown parameters represented by $\theta(k) = [\theta_1(k), \theta_2(k), \theta_3(k), \theta_4(k), \theta_5(k), \theta_6(k)]^T \in \mathfrak{R}^P$, $w(k) \in \mathfrak{R}^m$ is the noise signal (including process and measurement noises) that is assumed to be an arbitrary signal in $l_2$, $y(k) \in \Re^q$ is the measurement signal, and $s(k) \in \Re^r$ is the signal to be estimated. $\theta_i(k)$, i=1, 2, . . . , p, are bounded time-varying uncertain parameters with bounded variation $\Delta\theta_i(k)=\theta_i(k+1)-\theta_i(k)$. i=1, 2, . . . , p, and $A(\theta)$, $B(\theta)$, $C(\theta)$, $C_s(\theta)$, $D(\theta)$, and $D_s(\theta)$ are real matrices of appropriate dimensions that depend affinely on the parameter vector $\theta(k)$. Moreover, let $\Delta\theta(k)=\theta(k+1)-\theta(k)$.

In the above system, let $\Omega$ be a consistent polytope of $(\theta,\Delta\theta)$ and $\gamma>0$ to a given scalar. Suppose that there exist matrices $Q \in \Re^{n \times n}$, $S \in \Re^{n \times n}$, $W \in \Re^{n \times n}$, $Y \in \Re^{n \times q}$, $Z \in \Re^{r \times n}$, $L$ and symmetric matrices $X_i \in \Re^{2n \times 2n}$, i=0, . . . , p, and $X_q \in \Re^{k \times k}$ satisfying the following linear matrix inequalities:

$$\begin{bmatrix} \tilde{X}(\theta+\Delta\theta) & \tilde{A}(\theta) & \tilde{B}(\theta) & 0 \\ \tilde{A}^T(\theta) & \tilde{\gamma}-\tilde{X}(\theta) & 0 & \tilde{C}^T(\theta) \\ \tilde{B}^T(\theta) & 0 & \gamma I & D^T(\theta) \\ 0 & \tilde{C}(\theta) & D(\theta) & \gamma I \end{bmatrix} + LH(\theta,\Delta\theta) + H^T(\theta,\Delta\theta)L^T > 0, \quad (8)$$

$$\forall (\theta, \Delta\theta) \in V_\Omega$$

where I is the identify matrix, L is a matrix to be calculated, H is a matrix depending on the values of the unknown parameters and their variation rates, and T means matrix transpose.

$$\tilde{X}(\theta) = \begin{bmatrix} X_0 + X_1(\theta) & 0 \\ 0 & X_q \end{bmatrix} \quad (9)$$

$$X_1(\theta) = \sum_{i=1}^{p} \theta_i X_i \quad (10)$$

$$\tilde{A}(\theta) = \begin{bmatrix} A(\theta) & 0 \\ 0 & 0_K \end{bmatrix} \quad (11)$$

$$A(\theta) = \begin{bmatrix} RA(\theta) & 0 \\ S(\theta)A + YC(\theta) + Q & Q \end{bmatrix} \quad (12)$$

$$\tilde{B}(\theta) = \begin{bmatrix} B(\theta) \\ 0_{K \times m} \end{bmatrix} \quad (13)$$

$$B(\theta) = \begin{bmatrix} RB(\theta) \\ SB(\theta) + YD(\theta) \end{bmatrix} \quad (14)$$

$$\tilde{C}(\theta) = [C(\theta) \quad 0_{r \times k}] \quad (15)$$

$$D(\theta) = \lfloor D_s(\theta) - D_f D(\theta) \rfloor \quad (16)$$

$$C(\theta) = \lfloor C_s(\theta) - D_f C(\theta) - Z \quad -Z \rfloor \quad (17)$$

$$\tilde{Y} = \begin{bmatrix} Y & 0 \\ 0 & 0_K \end{bmatrix} \quad (18)$$

$$Y = \begin{bmatrix} R + R^T & S^T + W^T \\ S + W & W + W^T \end{bmatrix} \quad (19)$$

$$H(\theta,\Delta\theta) = [H_1(\theta,\Delta\theta) \quad H_2(\theta) \quad 0_{2k \times m} \quad 0_{2k \times r}] \quad (20)$$

-continued where $$H_1(\theta,\Delta\theta) = \begin{bmatrix} \Theta + \Delta\Theta & -I_K \\ 0 & 0_K \end{bmatrix},$$

$$H_2(\theta) = \begin{bmatrix} 0 & 0_K \\ \Theta & -I_K \end{bmatrix},$$

$\Theta = \theta \otimes I_{2n}$,
$\Delta\Theta = \Delta\theta \otimes I_{2n}$,
$\kappa = 2np$, and $\Theta$ represents a Kronecker product.

The output of the filter design process is four matrices $A_f$, $B_f$, $C_f$, $D_f$. Assuming that each parameter and its variation rate are bounded, a robust LTI $H_\infty$ observer filter with the transfer function matrix is represented as follows:

$$\hat{x}(k+1) = A_f \hat{x}(k) + B_f y(k) \quad (21)$$

$$\hat{s}(k) = C_f \hat{x}(k) + D_f y(k). \quad (22)$$

with $A_f = W^{-1}Q$; $B_f = W^{-1}Y$; $C_f = Z$; $D_f = D_f$. y(k) becomes the measured output by the vehicle battery system and is dependent upon whether voltage measurements and current measurements are available. The robust LTI $H_\infty$ observer can guarantee a prescribed upper bound on the $l_2$-gain from the uncertainty input signal w(k) to the estimation error e(k) for all admissible uncertain parameters. This ensures that the estimation error system is exponentially stable and that the following holds true for an optimization goal value ($\gamma$):

$$\frac{\|e(k)\|_2}{\|w(d)\|_2} < \gamma \quad (23)$$

for all $(\theta, \Delta\theta) \in \Omega$.

where $e(k)=s(k)-\hat{s}(k)$ $e(k)=s(k)-\hat{s}(k)$, and $\Omega$ is a consistent polytope of $(\theta,\Delta\theta)$. In this design process, e(k) is actually the estimation error of $V_{oc}$, and w(k) is actually the measured current signal. The objective is to recursively minimize the optimization goal value $\gamma$ until the filter design can no longer provides a feasible solution. Thereafter, bound values associated with a lowest optimization goal value that provides a feasible solution are utilized in the filter.

In the case where both voltage and current sensors are available, the filter design is as follows:

$$\hat{x}(k+1) = A_f \hat{x}(k) + B_f [V(k)I(k)]^T \quad (24)$$

$$\hat{s}(k) = C_f \hat{x}(k) + D_f [V(k)I(k)]. \quad (25)$$

If inputs from both a battery voltage sensor and a battery current sensor are available, then the following representations hold for the matrices of the observers:

$$y(k) = [V(k) \quad I(k)]^T, \quad (26)$$

$$s(k) = V_{oc}(k), \quad (27)$$

$$\theta(k) = [\theta_1(k) \quad \theta_2(k) \quad \theta_3(k) \quad \theta_4(k) \quad \theta_5(k) \quad \theta_6(k)], \quad (28)$$

-continued $$A(\theta(k)) = \begin{bmatrix} \theta_1(k) & 0 & 0 \\ 0 & \theta_2(k) & 0 \\ 0 & 0 & 1 \end{bmatrix}, \quad (29)$$

$$B(\theta(k)) = \begin{bmatrix} \theta_3(k) \\ \theta_4(k) \\ \theta_5(k) \end{bmatrix},$$

$$C(\theta(k)) = \begin{bmatrix} 1 & 1 & 1 \end{bmatrix},$$

$$D(\theta(k)) = \theta_6(k),$$

$$C_s(\theta(k)) = \begin{bmatrix} 0 & 0 & 1 \end{bmatrix},$$

$$D_s(\theta(k)) = \theta_5(k).$$

Figure 3:
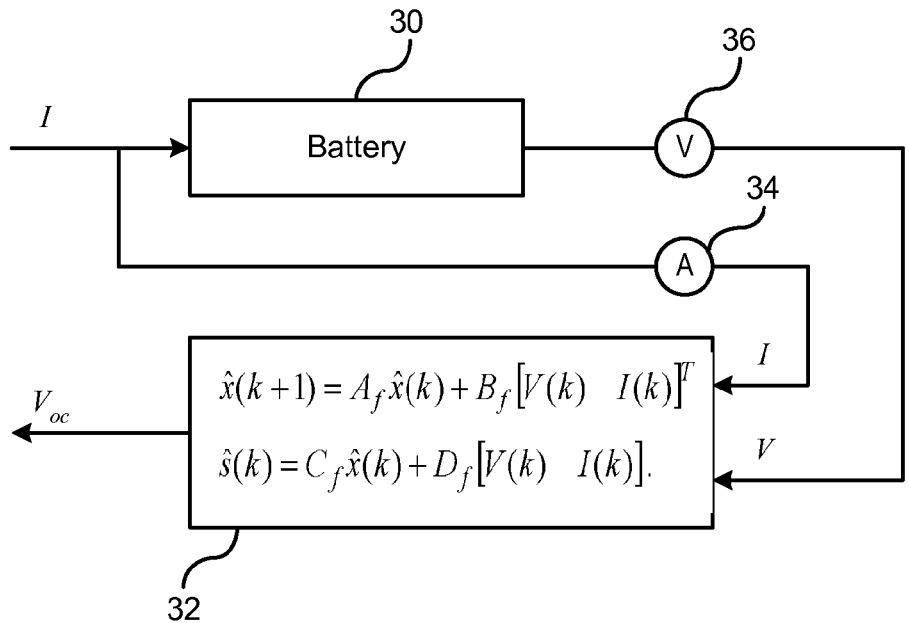
FIG. 3 a block diagram of a first Linear Time Invariant (LTI) H-infinity observer filter as a function of measured voltage and current.

FIG. 3 illustrates a block flow diagram for a robust LTI $H_\infty$ observer for estimating the battery states and the $V_{oc}$. A battery 30 is monitored by a robust LTI $H_\infty$ observer 32. A current sensor 34 senses a terminal current draw from the battery 30. A voltage sensor 36 senses a terminal voltage draw from the battery 30. The sensed voltage and current are input to the robust LTI $H_\infty$ observer 32. Given expressions provided above, the $V_{oc}$ is determined.

In the event a current sensor is not implemented on the system, is not available, or fails to work, then the system can switch to using a voltage-only based filter. A current sensor fault could be diagnosed online and algorithms utilizing response signals from the current sensor are disabled and the voltage-only based filter is enabled. In the case where only the battery voltage sensor is available, the filter design is as follows:

$$\hat{x}(k+1) = A_f \hat{x}(k) + B_f V(k) \quad (30)$$

$$\hat{s}(k) = C_f \hat{x}(k) + D_f V(k). \quad (31)$$

If only voltage from a battery voltage sensor is available, then the following representations hold for the matrices of the observers:

$$y(k) = V(k), \quad (32)$$

$$s(k) = V_{oc}(k), \quad (33)$$

$$\theta(k) = [\theta_1(k) \ \theta_2(k) \ \theta_3(k) \ \theta_4(k) \ \theta_5(k) \ \theta_6(k)], \quad (34)$$

$$A(\theta(k)) = \begin{bmatrix} \theta_1(k) & 0 & 0 \\ 0 & \theta_2(k) & 0 \\ 0 & 0 & 1 \end{bmatrix}, \quad (35)$$

$$B(\theta(k)) = \begin{bmatrix} \theta_3(k) \\ \theta_4(k) \\ \theta_5(k) \end{bmatrix},$$

$$C(\theta(k)) = \begin{bmatrix} 1 & 1 & 1 \end{bmatrix},$$

$$D(\theta(k)) = \theta_6(k),$$

$$C_s(\theta(k)) = \begin{bmatrix} 0 & 0 & 1 \end{bmatrix},$$

$$D_s(\theta(k)) = \theta_5(k).$$

Figure 4:
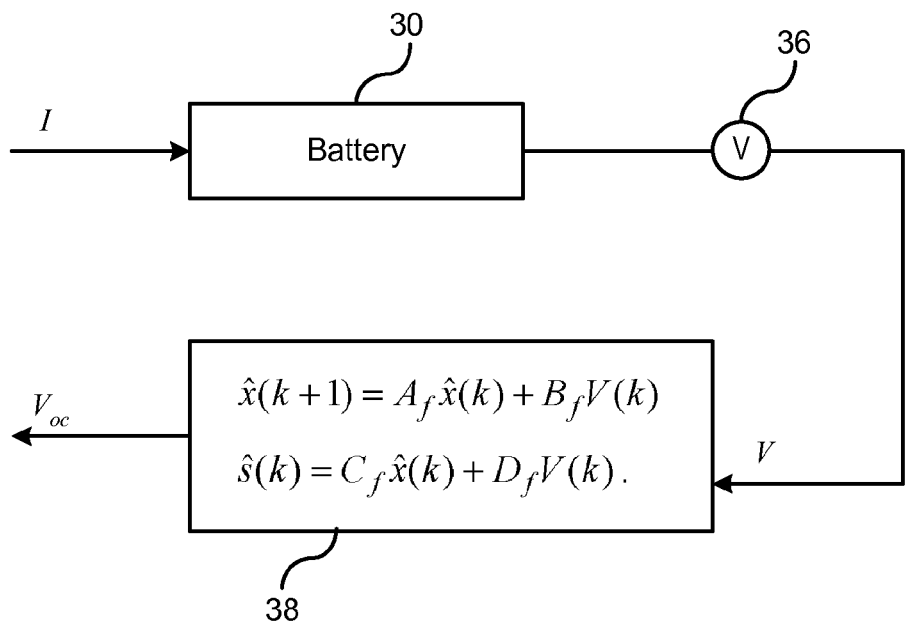
FIG. 4 a block diagram of a second LTI H-infinity observer filter as a function of measured voltage.

FIG. 4 illustrates a block flow diagram for a robust LTI $H_\infty$ observer for estimating the battery states and the $V_{oc}$. The battery 30 is monitored by a robust LTI $H_\infty$ observer 38. A voltage sensor 36 senses a terminal voltage draw from the battery 30. The sensed voltage is input to the robust LTI $H_\infty$ observer 38. Given expressions provided above, the $V_{oc}$ is determined.

In either case (i.e., whether both voltage sensor and current sensor are available or only voltage sensor), $\theta(k)$ transforms affinely into the state-space model matrices. The battery parameters $\theta_1(k)$, $\theta_2(k)$, $\theta_3(k)$, $\theta_4(k)$, $\theta_5(k)$, $\theta_6(k)$ are all bounded as is the variation speed of $\theta_1(k)$, $\theta_2(k)$, $\theta_3(k)$, $\theta_4(k)$, $\theta_5(k)$, $\theta_6(k)$. As a result, a robust $H_\infty$ filter design is applied to the LTI filter, also known as a stationary asymptotically stable filter, for each case that is capable of achieving a prescribed upper bound on the $l_2$-gain form the current signal to the $V_{oc}$ estimation error. That is, the current has a minimum impact on $V_{oc}$ estimation from an energy perspective. The upper bound holds for all possible values of the bounded $\theta(k)$ whose variation is also bounded.

Once the respective robust LTI $H_\infty$ observer filter is enabled, the battery measurements whether voltage and current measurements or voltage only measurements are input to the robust LTI $H_\infty$ observer. The robust LTI $H_\infty$ observer will generate an estimated signal s(k). As shown in eq. (26) and (32), the estimated signal s(k) is equal to the $V_{oc}$. In response to determining the $V_{oc}$, the SOC can be determined from a lookup table that is a function of the $V_{oc}$-SOC. The $V_{oc}$-SOC lookup table provides respective $V_{oc}$ values that correlate to the respective SOC values.

The battery may then be regulated in response to the estimated SOC. Enhanced robustness relative to battery age, battery variations, operating conditions, current sensor noise, and reduced calibration time may be achieved. Enhancing the regulation of the battery for supplying power to other devices by knowing the estimated SOC of the battery include, but are not limited to, power outlets adapted to an external device, accessories, components, subsystems, and systems of a vehicle.

Figure 5:
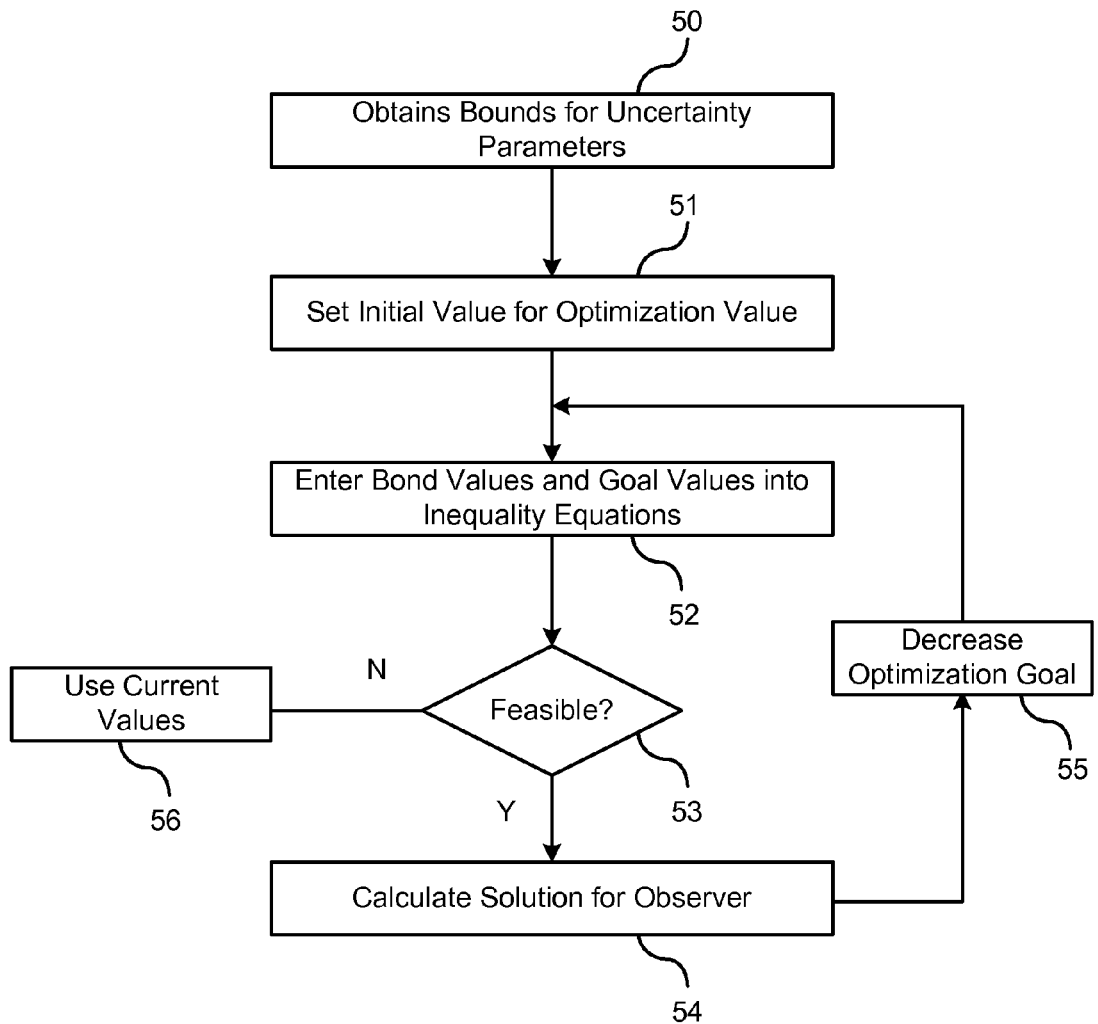
FIG. 5 is a flowchart of a process for designing a LTI observer H-infinity filter.

FIG. 5 illustrates a flowchart for offline optimization and calibration of the LTI $H_\infty$ observer.

In step 50, bounds for uncertainty parameters and their associated variation rates are obtained.

In step 51, an initial value is set for the $H_\infty$ optimization goal value $\gamma$.

In step 52, bound values and the optimization goal value $\gamma$ are entered into the inequality equations (eq. 8) which guarantee achievement of the system stability and optimization goal based on whether the equations are feasible.

In step 53, a determination is made as to whether the equations are feasible. If the equations are feasible the routine proceeds to step 54. If the equations are not feasible, the routine proceeds to step 56.

In step 54, in response to the equations being feasible, a solution is obtained and matrices are calculated for the observer $A_f$, $B_f$, $C_f$, $D_f$.

In step 55, the optimization goal is decreased and a return is made to step 52 for determining whether a next set of solutions is feasible based on a next decreased value for the optimization goal $\gamma$.

In step 56, in response to a determination that the equations are not feasible (in step 52), the return stops. The value of the minimum value of optimization goal $\gamma$, in addition to the associated bound values, that successfully satisfied the inequality equations while executing the routine are identified. These respective values are set in the LTI $H_\infty$ filter for use online use.

While certain embodiments of the present invention have been described in detail, those familiar with the art to which this invention relates will recognize various alternative designs and embodiments for practicing the invention as defined by the following claims. For example, the invention described herein can be applied to all kinds of batteries by only changing the model.

What is claimed is:

1. A method of determining a state-of-charge for a battery while connected to a plurality of loads, the method comprising steps of:
measuring a terminal voltage of the battery;
measuring a temperature of the battery coinciding with the measured terminal voltage;
inputting the measured terminal voltage to a first linear time invariant infinity observer filter, the first linear time invariant infinity observer filter developed in an off-vehicle design process, wherein the first linear time invariant infinity observer filter minimizes a gain of an output energy signal to an input energy signal of the battery;
estimating, by a control module, an open circuit voltage in response to the measured terminal voltage input to the first linear time invariant infinity observer filter;
determining, by the control module, the state-of-charge of the battery as a function of the open circuit voltage; and
regulating the battery in response to the state-of-charge.

2. The method of claim 1 further comprising steps of:
determining whether a current sensor is available for measuring a terminal current draw of the battery;
measuring a terminal current draw of the battery coinciding with the measured terminal voltage in response to the current sensor being available;
inputting the measured terminal current draw and the measured terminal voltage to a second linear time invariant infinity observer filter in response to the current sensor being available; and
estimating the open circuit voltage as a function of the measured terminal voltage and the measured current draw by the second linear time invariant infinity observer.

3. The method of claim 2 wherein a battery system model utilizes a two-RC pair equivalent circuit model, wherein the two-RC pair equivalent circuit model is represented by the formula:

$$V = V_{oc} + IR + V_{dl} + V_{df}$$

where $V_{oc}$ is the open circuit voltage, $V_{dl}$ is a double layer voltage, $V_{df}$ is a diffuse voltage, I is a terminal battery current, and R is an ohmic resistance.

4. The method of claim 3 wherein the battery system model is transformed into discrete counterparts.

5. The method of claim 4 wherein the transformed battery system model is represented by the following matrices:

$$\begin{bmatrix} V_{dl}(k+1) \\ V_{df}(k+1) \\ V_{oc}(k+1) \end{bmatrix} = \begin{bmatrix} e^{-T/R_{ct}C_{dl}} & 0 & 0 \\ 0 & e^{-T/R_{df}C_{df}} & 0 \\ 0 & 0 & 1 \end{bmatrix} \begin{bmatrix} V_{dl}(k) \\ V_{df}(k) \\ V_{oc}(k) \end{bmatrix} +$$

$$\begin{bmatrix} R_{ct}(1 - e^{-T/R_{ct}C_{dl}}) \\ R_{df}(1 - e^{-T/R_{df}C_{df}}) \\ \mu \end{bmatrix} I(k)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + RI(k)$$

where $\mu$ describes the relationship between $V_{oc}$ and I , $C_{dl}$ is a double layer capacitance, $V_{dl}$ is a double layer voltage of the battery system model, of the battery system model, $R_{ct}$ is a charge transfer resistance of the battery system model, $V_{df}$ is a diffusion voltage of the battery system model, $C_{df}$ is a capacitance diffusion of the battery system model, $R_{df}$ is a diffusion resistance of the battery system model, R is the ohmic resistance, T is a sample time, V is the battery terminal voltage, and I is the battery terminal current; and
wherein parameters $R_{ct}$ , $C_{dl}$ , $R_{dl}$ , $C_{dl}$ , $\mu$ ,and R are time-varying.

6. The method of claim 5 wherein the parameters of the battery system model are bounded and are represented by the following formula:

$$\begin{bmatrix} V_{dl}(k+1) \\ V_{df}(k+1) \\ V_{oc}(k+1) \end{bmatrix} = \begin{bmatrix} \theta_1(k) & 0 & 0 \\ 0 & \theta_2(k) & 0 \\ 0 & 0 & 1 \end{bmatrix} \begin{bmatrix} V_{dl}(k) \\ V_{df}(k) \\ V_{oc}(k) \end{bmatrix} + \begin{bmatrix} \theta_3(k) \\ \theta_4(k) \\ \theta_5(k) \end{bmatrix} I(k) \quad (3)$$

$$V(k) = \begin{bmatrix} 1 & 1 & 1 \end{bmatrix} \begin{bmatrix} V_{dl}(k) \\ V_{df}(k) \\ V_{oc}(k) \end{bmatrix} + \theta_6(k) I(k) \quad (4)$$

where
$\theta_1(k) = e^{-T/R_{ct}C_{dl}}$,
$\theta_2(k) = e^{-T/R_{df}C_{df}}$,
$\theta_3(k) = R_{ct}(1 - e^{-T/R_{df}C_{df}})$,
$\theta_4(k) = R_{df}(1 - e^{-T/R_{dl}C_{dl}})$,
$\theta_5(k) = \mu$, and
$\theta_6(k) = R$.

7. The method of claim 6 further comprising a step of generating a state vector of the battery system model which is represented by the following formula:

$$x(k) = \lfloor V_{dl}(k) V_{df}(k) V_{oc}(k) \rfloor$$

where $V_{oc}$ is the open circuit voltage, $V_{dl}$ is a double layer voltage, $V_{df}$ is a diffuse voltage, I is a terminal battery current, and R is an ohmic resistance.

8. The method of claim 7 further comprising a step of generating an augmented system model as represented by the following expression:

$$x(k+1) = A(\theta(k))x(k) + B(\theta(k))w(k)$$

$$y(k) = C(\theta(k))x(k) + D(\theta(k))w(k)$$

$$s(k) = C_s(\theta(k))x(k) + D_s(\theta(k))w(k)$$

where $\theta(k)$ is a vector of unknown parameters represented by $\theta(k) = [\theta_1(k), \theta_2(k), \theta_3(k), \theta_4(k), \theta_5(k), \theta_6(k)]$ , w(k) is an uncertain input signal, s(k) is a signal estimated online, y(k) is an output signal that is a function of battery parameter measurements available online, and A ,B ,C ,D are coefficients of matrices representing an output of an LTI (linear time invariant) infinity observer filter.

9. The method of claim 8 wherein elements of the first LTI infinity observer filter are represented by the following observation:

$$y(k) = V(k);$$

$$s(k) = V_{oc}(k);$$

$$\theta(k) = [\theta_1(k) \quad \theta_2(k) \quad \theta_3(k) \quad \theta_4(k) \quad \theta_5(k) \quad \theta_6(k)];$$

-continued $$A(\theta(k)) = \begin{bmatrix} \theta_1(k) & 0 & 0 \\ 0 & \theta_2(k) & 0 \\ 0 & 0 & 1 \end{bmatrix},$$

$$B(\theta(k)) = \begin{bmatrix} \theta_3(k) \\ \theta_4(k) \\ \theta_5(k) \end{bmatrix};$$

$C(\theta(k)) = [\, 1 \ \ 1 \ \ 1 \,],$ $D(\theta(k)) = \theta_6(k);$ and $C_s(\theta(k)) = [\, 0 \ \ 0 \ \ 1 \,],$ $D_s(\theta(k)) = \theta_5(k).$ 10. The method of claim 9 wherein the first LTI infinity observer filter is represented as follows:

$\hat{x}(k+1) = A_f \hat{x}(k) + B_f V(k)$ $\hat{s}(k) = C_f \hat{x}(k) + D_f V(k)$ where $A_f$, $B_f$, $C_f$, $D_f$ are output matrices from a filter design process of the first LTI infinity observer.

11. The method of claim 10 wherein elements of the second LTI infinity observer filter are represented by the following observation:

$y(k) = [\, V(k) \ \ I(k) \,]^T;$ $s(k) = V_{oc}(k);$ $\theta(k) = [\, \theta_1(k) \ \ \theta_2(k) \ \ \theta_3(k) \ \ \theta_4(k) \ \ \theta_5(k) \ \ \theta_6(k) \,];$ $$A(\theta(k)) = \begin{bmatrix} \theta_1(k) & 0 & 0 \\ 0 & \theta_2(k) & 0 \\ 0 & 0 & 1 \end{bmatrix},$$

$$B(\theta(k)) = \begin{bmatrix} \theta_3(k) \\ \theta_4(k) \\ \theta_5(k) \end{bmatrix};$$

$C(\theta(k)) = [\, 1 \ \ 1 \ \ 1 \,],$ $D(\theta(k)) = \theta_6(k);$ and $C_s(\theta(k)) = [\, 0 \ \ 0 \ \ 1 \,],$ $D_s(\theta(k)) = \theta_5(k).$ 12. The method of claim 11 wherein the second LTI observer infinity observer filter is represented as follows:

$\hat{x}(k+1) = A_f \hat{x}(k) + B_f [V(k) \ I(k)]^T$ $\hat{s}(k) = C_f \hat{x}(k) + D_f [V(k) \ I(k)]$ where $A_f$, $B_f$, $C_f$, $D_f$ are output matrices from a filter design process of the second LTI infinity observer.

13. The method of claim 12 wherein a set of bound values and variation rate values for the parameters of the filter design process are selected for the first LTI infinity observer filter/the second LTI infinity observer filter based on whether an optimization goal value can achieve a predetermined upper bound of a gain that is a function of an uncertain input signal and an estimation error as represented by the following formula:

$$\frac{\|e(k)\|_2}{\|w(d)\|_2} < \gamma$$

where $\gamma$ is the optimization goal value, e(k) is an estimation error of $V_{oc}$, and w(k) is the measured current signal.

14. The method of claim 13 wherein the set of bound values, variation rate values, and the optimization goal value for the parameters of the filter design process that achieve the predetermined upper bound of the gain are determined valid if the following inequality is satisfied:

$$\begin{bmatrix} \tilde{X}(\theta + \Delta\theta) & \tilde{A}(\theta) & \tilde{B}(\theta) & 0 \\ \tilde{A}^T(\theta) & \tilde{\gamma} - \tilde{X}(\theta) & 0 & \tilde{C}^T(\theta) \\ \tilde{B}^T(\theta) & 0 & \gamma I & D^T(\theta) \\ 0 & \tilde{C}(\theta) & D(\theta) & \gamma I \end{bmatrix} + LH(\theta, \Delta\theta) + H^T(\theta, \Delta\theta)L^T > 0,$$

$\forall \, (\theta, \Delta\theta) \in V_\Omega$ where $\theta$ is a vector of a respective parameter, $\Delta\theta$ is a variation rate, $\gamma$ the optimization goal value, I is the identify matrix, L is a matrix to be calculated, and H is a matrix depending on the values of the unknown parameters and their variation rate.

15. The method of claim 14 wherein the optimization goal value is recursively decreased and evaluated for determining whether the each decreased optimization value and associated set of bound and variation rate values satisfy the inequality, and wherein a lowest optimization value from the evaluated optimization goal values that successfully satisfies the inequality is selected for both the first and the second LTI infinity observer filter.

16. The method of claim 1 further comprising a step of outputting the state of charge of the battery to an output device for displaying the state-of-charge to a user of a vehicle.

17. The method of claim 1 wherein the regulating step comprises outputting the state-of-charge of the battery to an electronic control unit for regulating the battery terminal voltage.

18. The method of claim 1 wherein the regulating step comprises outputting the state-of-charge of the battery to an electronic control unit for improving fuel economy of a vehicle.

19. The method of claim 1 wherein the state-of-charge is derived from an open circuit voltage-state-of-charge lookup table stored in a memory of a vehicle.

* * * * *